US012707984B2

(12) United States Patent
Rimbert-Riviere

(10) Patent No.: US 12,707,984 B2
(45) Date of Patent: Aug. 11, 2026

(54) SUBSTRATE BARCODE READABILITY ENHANCEMENT STRUCTURES AND METHOD

(71) Applicant: Infineon Technologies AG, Neubiberg (DE)

(72) Inventor: Charles Rimbert-Riviere, Soest (DE)

(73) Assignee: Infineon Technologies AG, Neubiberg (DE)

(*) Notice: Subject to any disclaimer, the term of this patent is extended or adjusted under 35 U.S.C. 154(b) by 481 days.

(21) Appl. No.: 18/130,692

(22) Filed: Apr. 4, 2023

(65) Prior Publication Data

US 2024/0339416 A1 Oct. 10, 2024

(51) Int. Cl.

| | |
|---|---|
| ***H10W 46/00*** | (2026.01) |
| ***H10W 70/40*** | (2026.01) |
| ***H10W 70/65*** | (2026.01) |

(52) U.S. Cl.

CPC ......... *H10W 46/00* (2026.01); *H10W 70/421* (2026.01); *H10W 70/65* (2026.01); *H10W 46/106* (2026.01)

(58) Field of Classification Search

None

See application file for complete search history.

(56) References Cited

U.S. PATENT DOCUMENTS

| | | | | |
|---|---|---|---|---|
| 4,915,994 | A * | 4/1990 | Begelfer | G09F 3/10 428/473.5 |
| 8,985,471 | B2 * | 3/2015 | Freeman | B42D 25/00 235/487 |
| 9,974,162 | B2 * | 5/2018 | Obinata | G06K 19/06028 |
| 2004/0241660 | A1 | 12/2004 | Wojtowicz et al. | |
| 2013/0188296 | A1 * | 7/2013 | Widhalm | H01B 1/026 205/271 |
| 2016/0055403 | A1 * | 2/2016 | Chou | G06K 1/12 235/494 |
| 2020/0243456 | A1 * | 7/2020 | Dankowski | H01L 23/49541 |
| 2020/0334509 | A1 | 10/2020 | Nguyen | |
| 2020/0335451 | A1 | 10/2020 | Dangelmaier et al. | |
| 2021/0175149 | A1 * | 6/2021 | Gaulin | H01L 23/3675 |

* cited by examiner

*Primary Examiner* — Timothy J Thompson
*Assistant Examiner* — John B Freal
(74) *Attorney, Agent, or Firm* — Murphy, Bilak & Homiller, PLLC

(57) ABSTRACT

Substrates for use with semiconductor devices are provided. The substrates include a barcode laser etched into a metallic surface or layer of the substrate. A wall of non-metallic material may be formed on the metallic surface or layer and frame the barcode. Separately or in combination, an optically transparent encapsulant may cover a region of the metallic surface or layer that includes the barcode, where the optically transparent encapsulant reduces oxidation of metallic debris produced by laser etching of the barcode and that remains on or near the barcode. Separately or in combination, the substrate may include an electrically insulative body covered by the metallic layer and a trench formed in the metallic layer along a perimeter of the barcode and that exposes the electrically insulative body. Methods of improving readability of the barcode are also provided.

20 Claims, 8 Drawing Sheets

114, 114_1
112
110
112
102
108
106
106
106
104
106
108
114

114, 114_1
112
110
112
102
300
106
106
106
104
106
300
114

100
104
106
114, 114_1
C'
106
110
106
300
106
106
114
C
114

SUBSTRATE BARCODE READABILITY ENHANCEMENT STRUCTURES AND METHOD

BACKGROUND

Ceramic substrates for use in power semiconductor applications often include a barcode for traceability. In some cases, the barcode is laser etched into a metallic surface of the substrate. The laser etching process produces metallic debris which collects on and around the barcode. Oxidation of the metallic debris creates a halo or corona effect during optical scanning of the barcode which reduces the barcode contrast, hampering readability. Subsequent processes such as washing, soldering, sintering, etc. further oxidize the metallic debris, worsening the halo/corona effect which further degrades readability. The barcode may become unreadable at which point traceability is lost.

SUMMARY

According to an embodiment of a substrate, the substrate comprises: a metallic surface; a barcode laser etched into the metallic surface; and a wall of non-metallic material formed on the metallic surface and framing the barcode.

According to another embodiment of a substrate, the substrate comprises: a metallic surface; a barcode laser etched into the metallic surface; and an optically transparent encapsulant covering a region of the metallic surface that includes the barcode, wherein the optically transparent encapsulant reduces oxidation of metallic debris produced by laser etching of the barcode and that remains on or near the barcode.

According to another embodiment of a substrate, the substrate comprises: an electrically insulative body; a metallic layer covering the electrically insulative body; a barcode laser etched into the metallic layer; and a trench formed in the metallic layer along a perimeter of the barcode and exposing the electrically insulative body.

According to an embodiment of processing a substrate, the method comprises: laser etching a barcode into a metallic surface of the substrate; after the laser etching, chemically etching the metallic surface to remove a surface layer portion of the metallic surface; and selecting one or more parameters of the laser etching such that the barcode is laser etched deep enough into the metallic surface so as to remain optically detectable after the chemical etching of the metallic surface.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figures 1A, 1B:
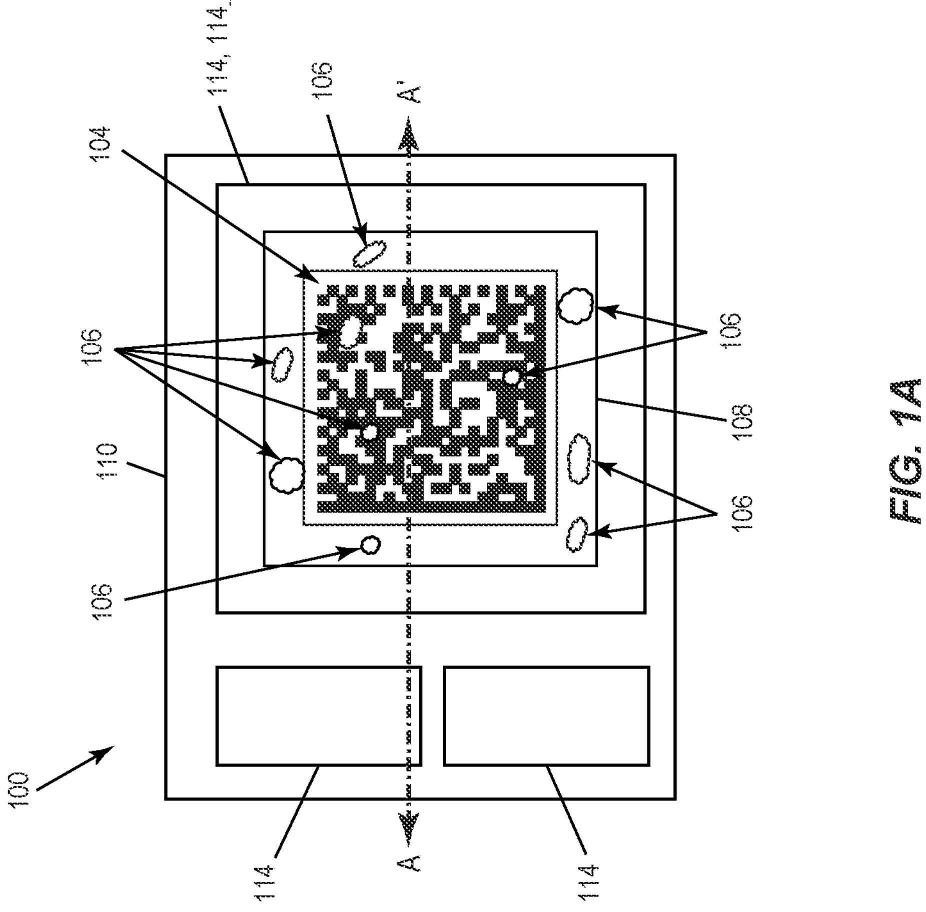
FIG. 1A illustrates a partial top plan view of a substrate having a structure that enhances readability of a barcode laser etched into a metallized surface of the substrate.
FIG. 1B illustrates a cross-sectional view of the substrate along the line labelled A-A' in FIG. 1A.

Embodiments described herein provide structures and a method for enhancing readability of a barcode laser etched into a metallized surface of a substrate used in power semiconductor applications. Power semiconductor substrates provide interconnections to form a power electronics circuit and/or cool components. For example, the substrate may be a DBC (direct bonded copper) substrate having a ceramic body with a layer of copper bonded to one or both sides of the ceramic body, an AMB (active metal brazed) substrate having a metallic layer soldered to a ceramic body, an IMS (insulated metal substrate) having a metal baseplate covered by a thin layer of dielectric such as an epoxy-based layer and a layer of copper on the dielectric, etc. The substrate instead may be a lead frame, a metallic baseplate, a metallic terminal, or a metallic busbar. Still other power semiconductor substrates may be used.

In each case, the substrate has a metallic surface and a barcode laser etched into the metallic surface. In some cases, the substrate has a wall of non-metallic material formed on the metallic surface and that frames the barcode. The wall provides a recognizable landmark for locating the barcode even if metallic debris produced by laser etching of the barcode remains on the wall, enhancing barcode readability.

Separately or in combination, an optically transparent encapsulant covers a region of the metallic surface that includes the barcode. The optically transparent encapsulant reduces oxidation of metallic debris produced by laser etching of the barcode and that remains on or near the barcode, enhancing barcode readability.

Separately or in combination, and in the case of a substrate having an electrically insulative body and a metallic layer covering the electrically insulative body such as DBC, AMB or IMS substrate, a trench is formed in the metallic layer along a perimeter of the barcode and exposing the electrically insulative body. Metallic debris produced by laser etching of the barcode collects in the trench, enhancing barcode readability.

The wall, encapsulant and trench structures may be used in combination with one another. For example, a substrate with a barcode laser etched into a metallic surface of the substrate may include the wall structure and/or the encapsulant structure and/or the trench structure.

Also described herein is an embodiment of a method of processing a substrate according to which a barcode is laser etched into a metallic surface of the substrate. After the laser etching, the metallic surface of the substrate is chemically etched to remove a surface layer portion of the metallic surface. One or more parameters of the laser etching are selected such that the barcode is laser etched deep enough into the metallic surface so as to remain optically detectable after the chemical etching of the metallic surface. Chemically etching the metallic surface of the substrate after laser etching the barcode removes any metallic debris caused by the laser etching.

Described next, with reference to the figures, are exemplary embodiments of structures and a method for enhancing readability of a barcode laser etched into a metallized surface of a substrate used in power semiconductor applications. Any of the barcode readability enhancement embodiments described herein may be used interchangeably unless otherwise expressly stated.

FIG. 1A illustrates a partial top plan view of a substrate 100 used in power semiconductor applications. FIG. 1B illustrates a cross-sectional view of the substrate 100 along the line labelled A-A' in FIG. 1A. The substrate 100 has a metallic surface 102 and a barcode 104 laser etched into the metallic surface 102. The metallic surface 102 may be plated, e.g., with Ni, Au, Ag, etc. The barcode 104 may be (linear) one-dimensional or (matrix) two-dimensional. For example, in FIGS. 1A and 1B, the barcode 104 is shown implemented as a QR barcode.

The barcode 104 is decipherable by a barcode reader system (not shown) and may store information about the substrate 100 such as production lot, production date, part number, etc. Information encoded in the barcode 100 is accessible by optically scanning the barcode 104 and may be used during subsequent processing that involves the substrate 100, e.g., such as manufacturing a power semiconductor package or module that includes the substrate 100.

The laser process for etching the barcode 104 into the metallic surface 102 of the substrate 100 may produce metallic debris 106 that collects on or near the barcode 100. Optical scanning of the barcode 100 may be hindered, depending on how much metallic debris 106 remains in the vicinity of the barcode 100. The metallic debris 106 may create a halo or corona effect during optical scanning of the barcode 104 which reduces the barcode contrast, hampering readability. Oxidation of the metallic debris 106 further reduces the contrast and may occur even if the metallic surface 102 is plated with Ni, Au, Ag, etc., since the laser etching process to form the barcode 104 cuts through the relatively thin plating and into the underlying thick base metallic layer such as Cu, Al, AlCu, AlCuSi, etc. The metallic debris 106 may further oxidize during subsequent processing of the substrate 100, e.g., temperature processing, atmospheric (pressure) processing, etc.

To enhance the contrast of the barcode 104 and improve readability in case metallic debris 106 collects on or near the barcode 100, the substrate 100 in FIGS. 1A and 1B also includes a wall (ridge, etc.) of non-metallic material 108 formed on the metallic surface 102 of the substrate 100 and that (laterally) frames the barcode 104. The non-metallic material 108 may comprise a polymer such as polyimide or any other type of resin or organic material (e.g., acrylic, polyacrylic, etc.), wax, photoresist, etc. For example, the non-metallic material 108 may comprise a solder stop material such as a solder mask or solder resist which is a thin lacquer-like layer of polymer applied, e.g., by screen printing at a thickness in a range of 1 μm to 10 μm to the metallic surface 102 of the substrate 100.

Metallic debris 106 produced by laser etching of the barcode 104 may be less likely to adhere to the non-metallic material 108, e.g., in the case of an organic polymer. Even if metallic debris 106 produced by the barcode laser etching collects on the non-metallic material 108, the wall of non-metallic material 108 is raised compared to the barcode 104 and therefore has a different focal depth than the barcode 104, improving barcode readability. Also, the wall of non-metallic material 108 provides a defined shape/structure for more accurately locating the barcode 104 even if the barcode contrast is reduced by metallic debris 106 which improves readability of the barcode 104. It is also contemplated that the color of the non-metallic material 108 could be selected to enhance the contrast between the wall structure 108 and the barcode 104 so as to improve barcode readability. The color of the non-metallic material 108 could also be selected so as to reduce contrast between the non-metallic material 108 and the metallic debris 106, thereby decreasing debris visibility and improving barcode readability. The wall of non-metallic material 108 may be continuous or have one or more gaps.

In FIGS. 1A and 1B, the substrate 100 includes an electrically insulative body 110 and the metallic surface 102 with the laser etched barcode 104 covers the electrically insulative body 110. For example, the substrate 100 may be a DBC or AMB substrate where the electrically insulative body 110 is ceramic and the metallic surface 102 with the laser etched barcode 104 is formed by a metallic layer 112 such as a layer of copper or aluminum bonded to one or both sides of the ceramic body 110. In the case of a DBC or AMB substrate 100, the wall of non-metallic material 108 is formed on the metallic (copper, aluminum, etc.) layer 112 with the laser etched barcode 104.

The substrate 100 instead may be an IMS substrate where the electrically insulative body 110 is a dielectric layer such as an epoxy-based layer and the metallic surface 102 with the laser etched barcode 104 is formed by a layer 112 of copper on the dielectric layer 110. In the case of an IMS substrate 100, the wall of non-metallic material 108 is formed on the copper layer 112 with the laser etched barcode 104.

The substrate 100 instead may be a lead frame such as a Cu lead frame where the metallic surface 102 with the laser etched barcode 104 is a surface of the lead frame. In the case of a lead frame as the substrate 100, the wall of non-metallic material 108 is formed on the lead frame surface 102 with the laser etched barcode 104.

The substrate 100 instead may be a metallic baseplate such as a Cu or Ni baseplate where the metallic surface 102 with the laser etched barcode 104 is a surface of the metallic baseplate. In the case of a metallic baseplate as the substrate 100, the wall of non-metallic material 108 is formed on the surface 102 of the metallic baseplate with the laser etched barcode 104.

The substrate 100 instead may be a metallic terminal or busbar where the metallic surface 102 with the laser etched barcode 104 is a surface of the metallic terminal or busbar. In the case of a metallic terminal or busbar as the substrate 100, the wall of non-metallic material 108 is formed on the surface 102 of the metallic terminal or busbar with the laser etched barcode 104.

As previously explained herein, the metallic surface 102 of the substrate 100 with the laser etched barcode 104 may be plated, e.g., with Ni, Au, Ag, etc. Separately or in combination, the metallic surface 102 of the substrate 100 with the laser etched barcode 104 may be patterned into a plurality of islands 114 where the barcode 104 is laser etched into one of the islands 114_1 and the wall of non-metallic material 108 is formed on the same island 114_1 as the barcode 104.

Figures 2A, 2B:
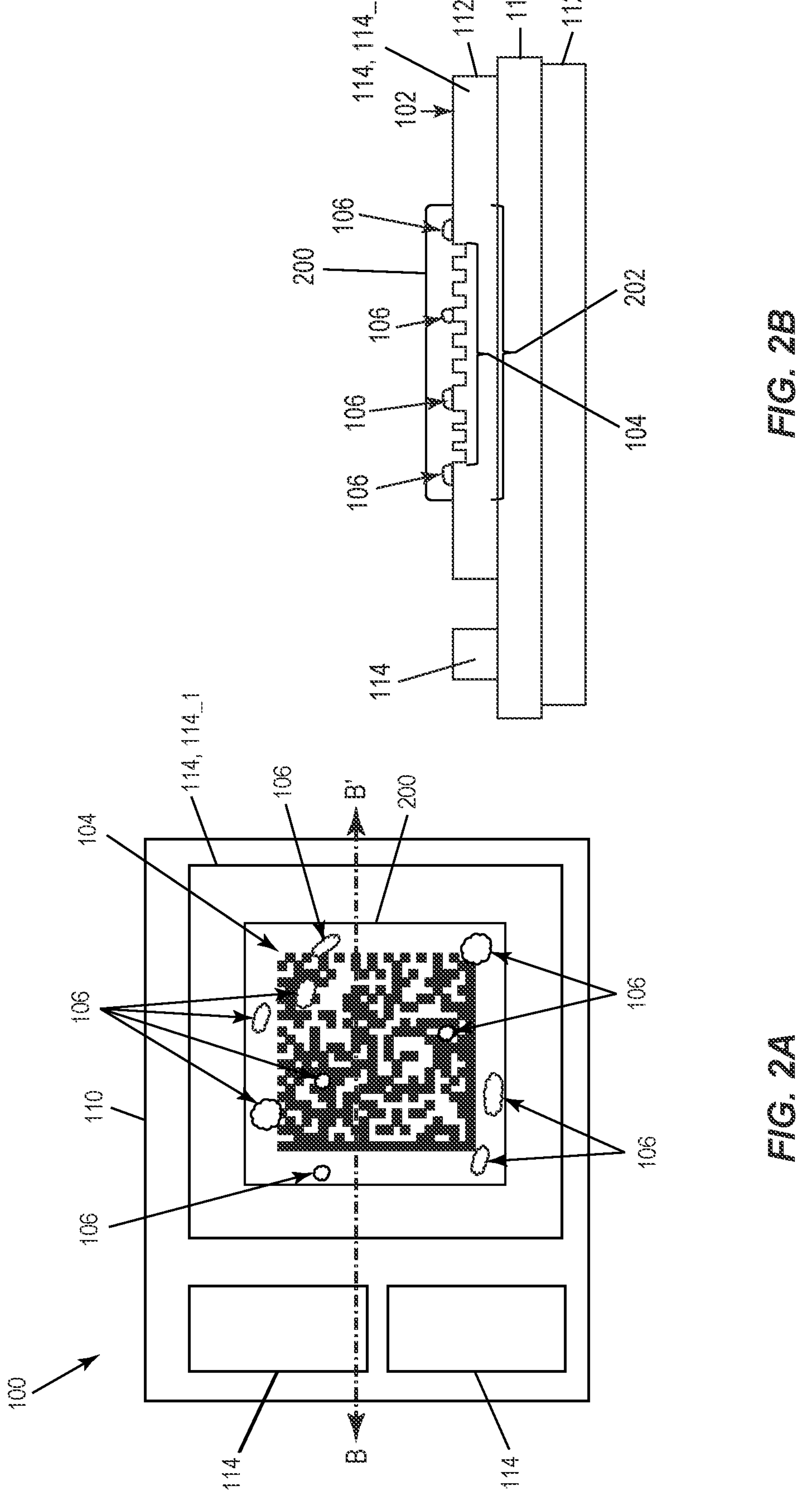
FIG. 2A illustrates a partial top plan view of a substrate having a structure that enhances readability of a barcode laser etched into a metallized surface of the substrate, according to another embodiment.
FIG. 2B illustrates a cross-sectional view of the substrate along the line labelled B-B' in FIG. 2A.

FIG. 2A illustrates a partial top plan view of the substrate 100 and FIG. 2B illustrates a cross-sectional view of the substrate 100 along the line labelled B-B' in FIG. 2A, according to another embodiment. In FIGS. 2A and 2B, the substrate 100 includes an optically transparent encapsulant 200 that covers a region 202 of the metallic surface 102 that includes the barcode 104. The optically transparent encapsulant 200 reduces oxidation of metallic debris 106 produced by laser etching of the barcode 104 and which remains on or near the barcode 104, by partly or completely sealing the barcode 104 from oxidative elements and/or conditions. The optically transparent encapsulant 200 may be formed on the metallic surface 102 before or after laser etching of the barcode 104 into the same surface 102. For example, in the case of an organic polymer or resin such as polyimide, the optically transparent encapsulant 200 may be screen printed, e.g., at a thickness in a range of 1 μm to 10 μm onto the metallic surface 102 before or after laser etching of the barcode 104.

In the case of a DBC or AMB substrate 100, the optically transparent encapsulant 200 covers a region 202 of the copper layer 112 that includes the barcode 104. In the case of a lead frame as the substrate 100, the optically transparent encapsulant 200 covers a region 202 of the surface 102 of the lead frame that includes the barcode 104. In the case of a metallic baseplate as the substrate 100, the optically transparent encapsulant 200 covers a region 202 of the surface 102 of the metallic baseplate that includes the barcode 104. In the case of a metallic terminal or busbar as the substrate 100, the optically transparent encapsulant 200 covers a region 202 of the surface 102 of the metallic terminal or busbar that includes the barcode 104.

Figures 3A, 3B:
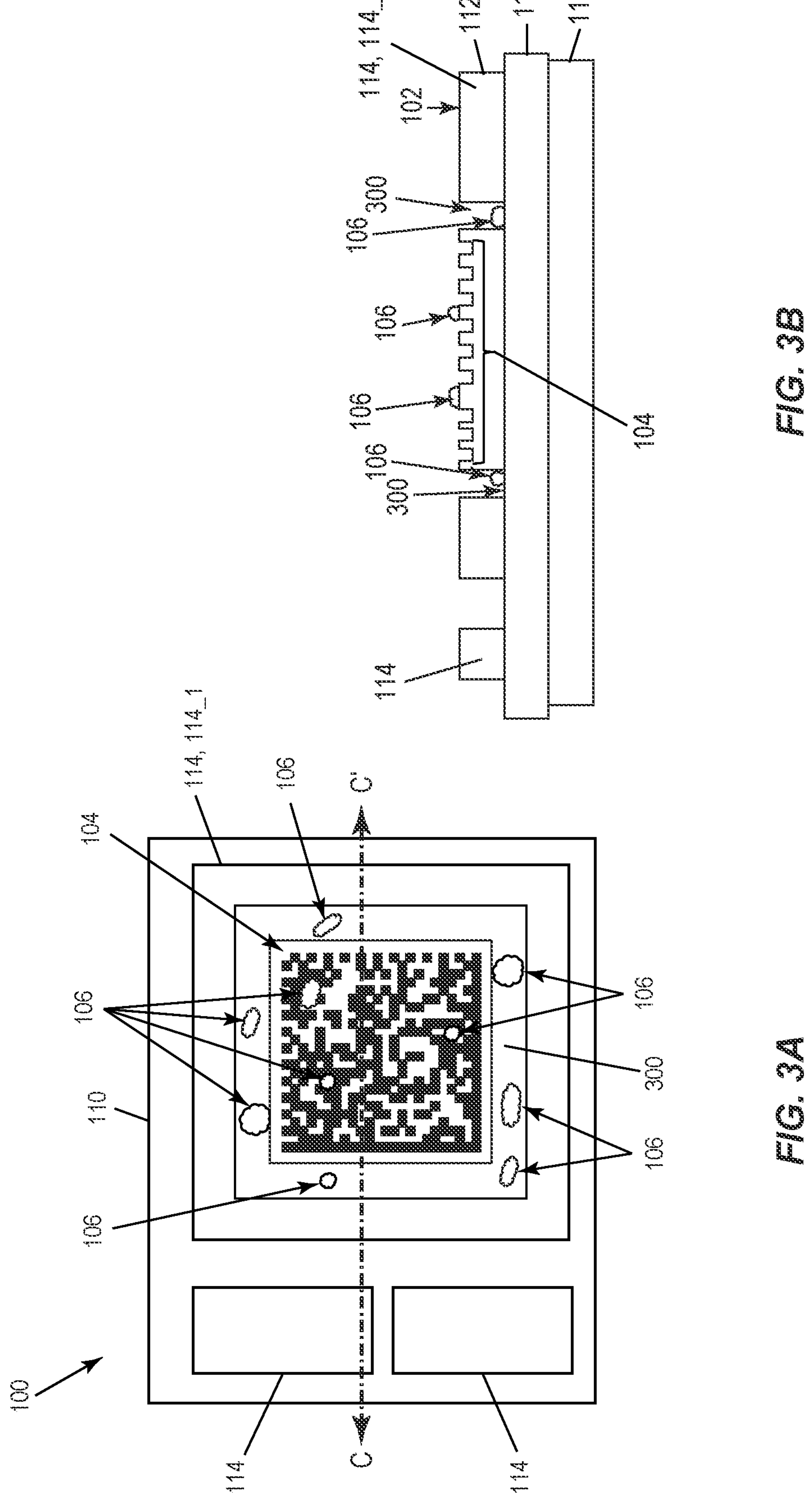
FIG. 3A illustrates a partial top plan view of a substrate having a structure that enhances readability of a barcode laser etched into a metallized surface of the substrate, according to another embodiment.
FIG. 3B illustrates a cross-sectional view of the substrate along the line labelled C-C' in FIG. 3A.

FIG. 3A illustrates a partial top plan view of the substrate 100 and FIG. 3B illustrates a cross-sectional view of the substrate 100 along the line labelled C-C' in FIG. 3A, according to another embodiment. In FIGS. 3A and 3B, the substrate 100 includes an electrically insulative body 110 such as a ceramic or dielectric layer and a metallic layer 112 such as Cu or Al covering the electrically insulative body 110. In FIGS. 3A and 3B, the substrate 100 also includes a trench 300 formed in the metallic layer 112 along a perimeter of the barcode 104 and that exposes the electrically insulative body 110 of the substrate 100.

The trench 300 may be formed in the metallic layer 112 of the substrate 100 before the barcode 104 is laser etched into the same metallic layer 112. For example, the design of the trench 300 may be included in mask information used to pattern the metallic layer 112 of the substrate 100 into a plurality of islands 114. The trench 300 collects metallic debris 106 produced during laser etching of the barcode 104 into the metallic layer 112 of the substrate 100. Since the trench 300 extends to the electrically insulative body 110 in FIG. 3B but the barcode 104 does not, metallic debris 106 that collects at the bottom of the trench 300 is at a different focal depth than the barcode 104 which aids readability of the barcode 104. Also, the exposed electrically insulative body 110 may provide high contrast between the metallic barcode 104 and the electrically insulative body 110, e.g., in the case of a ceramic electrically insulative body 110, further enhancing readability of the barcode 104. Like the wall of non-metallic material 108 in FIGS. 1A and 1B, the trench 300 in FIGS. 3A and 3B also provides a defined shape/structure for more accurately locating the barcode 104 even if the surrounding contrast is reduced by metallic debris 106.

The trench 300 is uninterrupted in FIGS. 3A and 3B. Accordingly, the island 114_1 of the metallic layer 112 into which the barcode 104 is laser etched is electrically floating in FIGS. 3A and 3B.

Figures 4A, 4B:
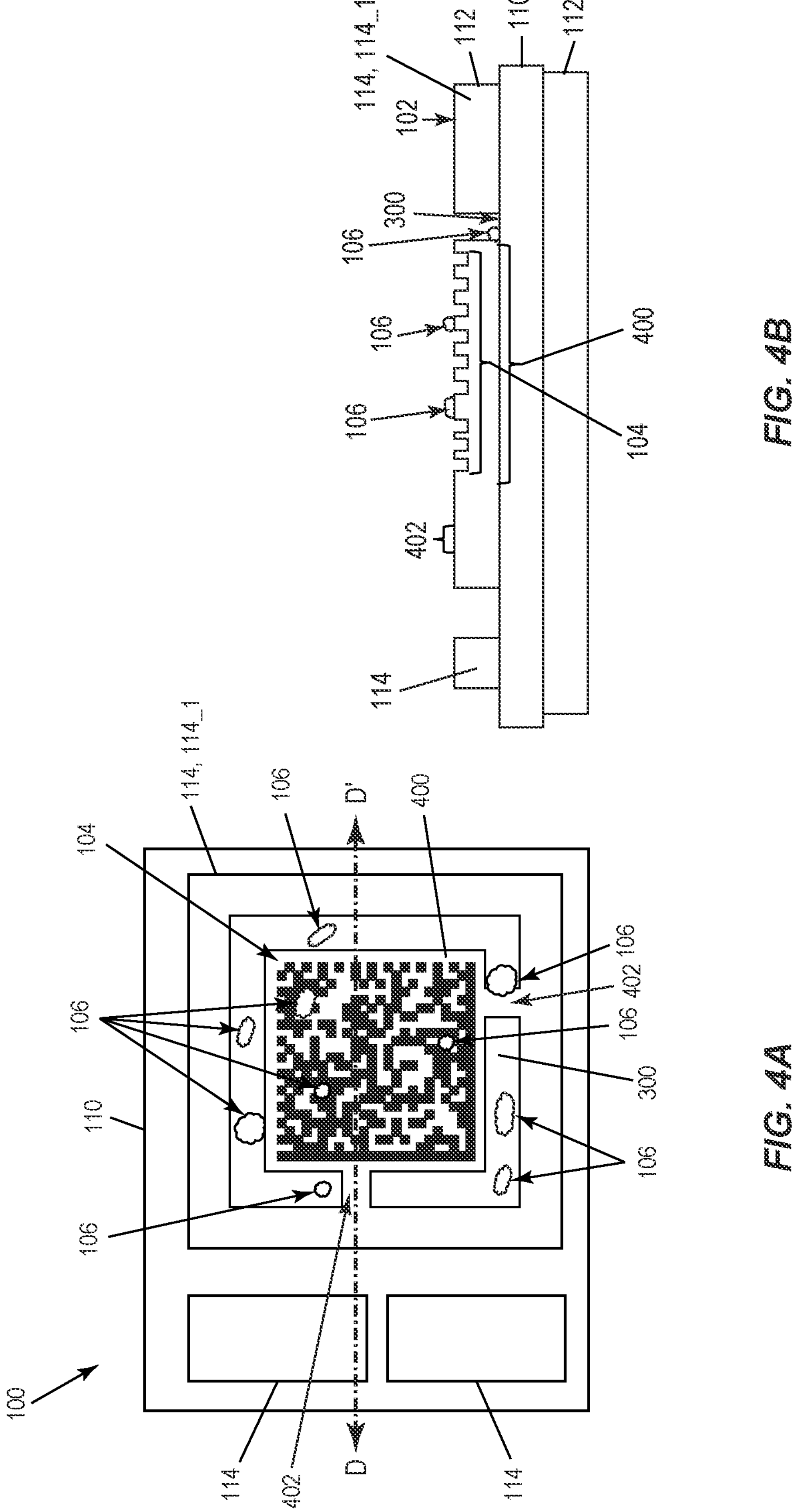
FIG. 4A illustrates a partial top plan view of a substrate having a structure that enhances readability of a barcode laser etched into a metallized surface of the substrate, according to another embodiment.
FIG. 4B illustrates a cross-sectional view of the substrate along the line labelled D-D' in FIG. 4A.

FIG. 4A illustrates a partial top plan view of the substrate 100 and FIG. 4B illustrates a cross-sectional view of the substrate 100 along the line labelled D-D' in FIG. 4A, according to another embodiment. The embodiment shown in FIGS. 4A and 4B is similar to the embodiment shown in FIGS. 3A and 4B. However, in FIGS. 4A and 4B, a region 400 of the island 114_1 of the metallic layer 112 into which the barcode 104 is laser etched is electrically connected to the remainder of the island 114_1 through one or more gaps 402 in the trench 300 which are filled by the metallic layer 112. Accordingly, the region 400 of the island 114_1 of the metallic layer 112 into which the barcode 104 is laser etched is not electrically floating in FIGS. 4A and 4B but instead is at the same electric potential as the remainder of the island 114_1 with the barcode 104.

The substrate 100 shown in FIGS. 3A-3B and/or 4A-4B may also include the optically transparent encapsulant 200 shown in FIGS. 2A-2B. The optically transparent encapsulant 200 may cover the region 400 of the island 114_1 of the metallic layer 112 into which the barcode 104 is laser etched, to reduce oxidation of metallic debris 106 produced by the laser etching and that remains in the trench 300 and/or on the barcode 104.

Figure 5:
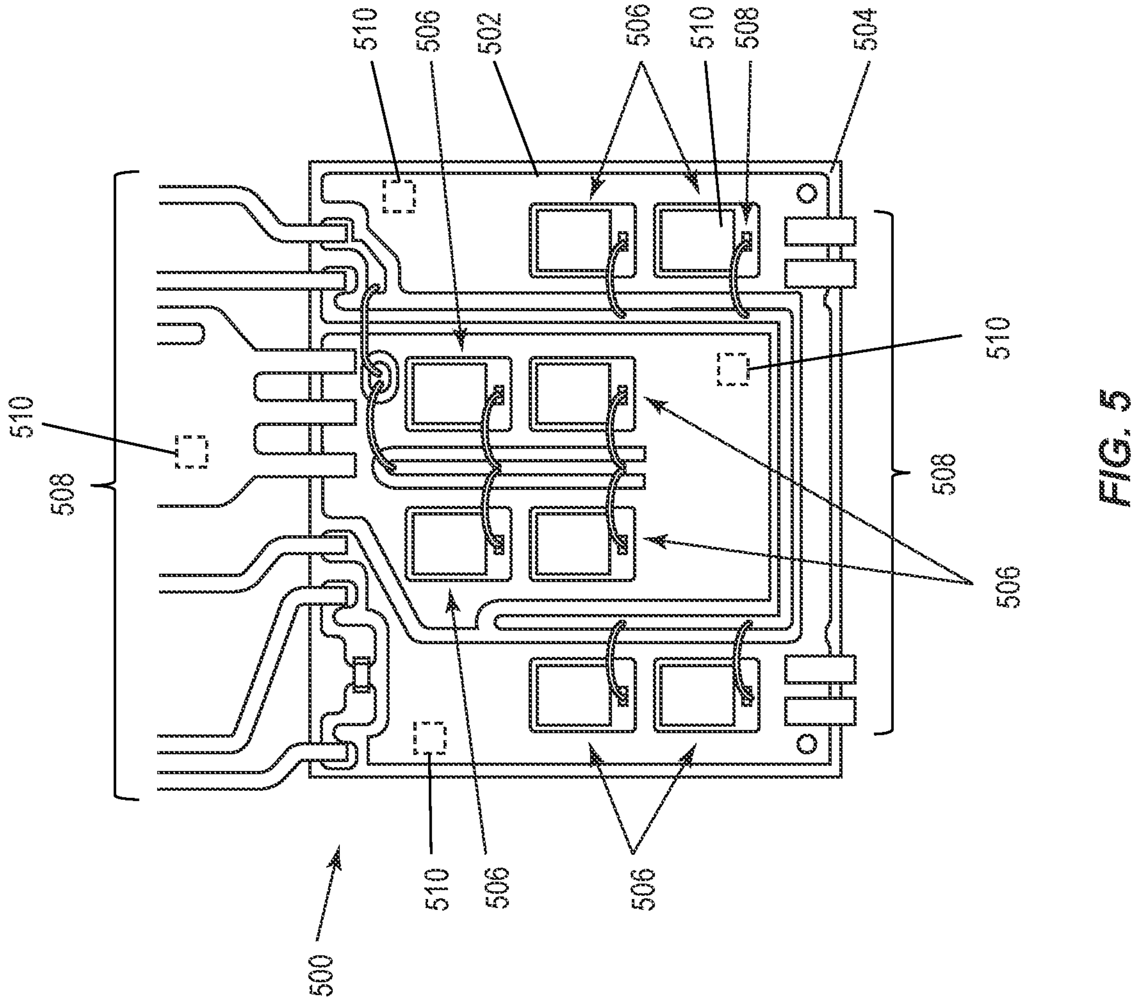
FIG. 5 illustrates a plan view of a power semiconductor substrate for use in a power semiconductor package or module and having a structure that enhances readability of a barcode laser etched into a metallized surface of the substrate.

FIG. 5 illustrates a plan view of a power semiconductor substrate 500 for use in a power semiconductor package or module which may form part of a power electronics circuit for use in various power applications such as in a DC/AC inverter, a DC/DC converter, an AC/DC converter, a DC/AC converter, an AC/AC converter, a multi-phase inverter, an H-bridge, DC motor drive, etc. The power semiconductor substrate 500 includes a patterned metallization 502 formed on an electrically insulative body 504 such as a ceramic or dielectric layer. The substrate metallization 502 is patterned to ensure proper routing of electrical connections for implementing a power electronics device such as a half bridge included in the power package or module. For example, the semiconductor substrate 500 may be a DBC substrate, an AMB substrate, or an IMS substrate.

Power transistor dies 506 are attached to the patterned metallization 502. The power transistor dies 506 may be 'vertical' dies in that the primary current flow path is between the front and back sides of each die 506. For example, the drain pad (out of view in FIG. 5) may be disposed at the die backside, with a gate pad 508 and a source pad 510 (and optionally one or more sense pads) at the die frontside. In one embodiment, the power transistor dies 506 are vertical SiC power MOSFET (metal-oxidesemiconductor field-effect transistor) dies. The power transistor dies 506 instead may be vertical Si power MOSFET dies, HEMT (high-electron mobility transistor) dies, IGBT (insulated-gate bipolar transistor) dies, JFET (junction filed-effect transistor) dies, etc. Additional types of semiconductor dies may be attached to the power semiconductor substrate 500 such as power diode dies, logic dies, controller dies, gate driver dies, etc. Metallic terminals and/or busbars 508 may be attached to the pattered metallization 502 of the power semiconductor substrate 500 to provide power and signal connections to the power semiconductor substrate 500.

The barcode 104 described herein may be laser etched into the pattered metallization 502 of the power semiconductor substrate 500 and/or into one or more of the metallic terminals and/or busbars 508. Example locations 510 for the barcode 104 are indicated by dashed boxes in FIG. 5. Each barcode location 510 includes the laser etched barcode 104 described herein in combination with the wall structure 108 and/or the optically transparent encapsulant structure 200 and/or the trench structure 300 also described herein. Accordingly, information encoded in the barcode 104 is optically readable during manufacture of the power semiconductor package or module that includes the power semiconductor substrate 500.

Figures 6A, 6B:
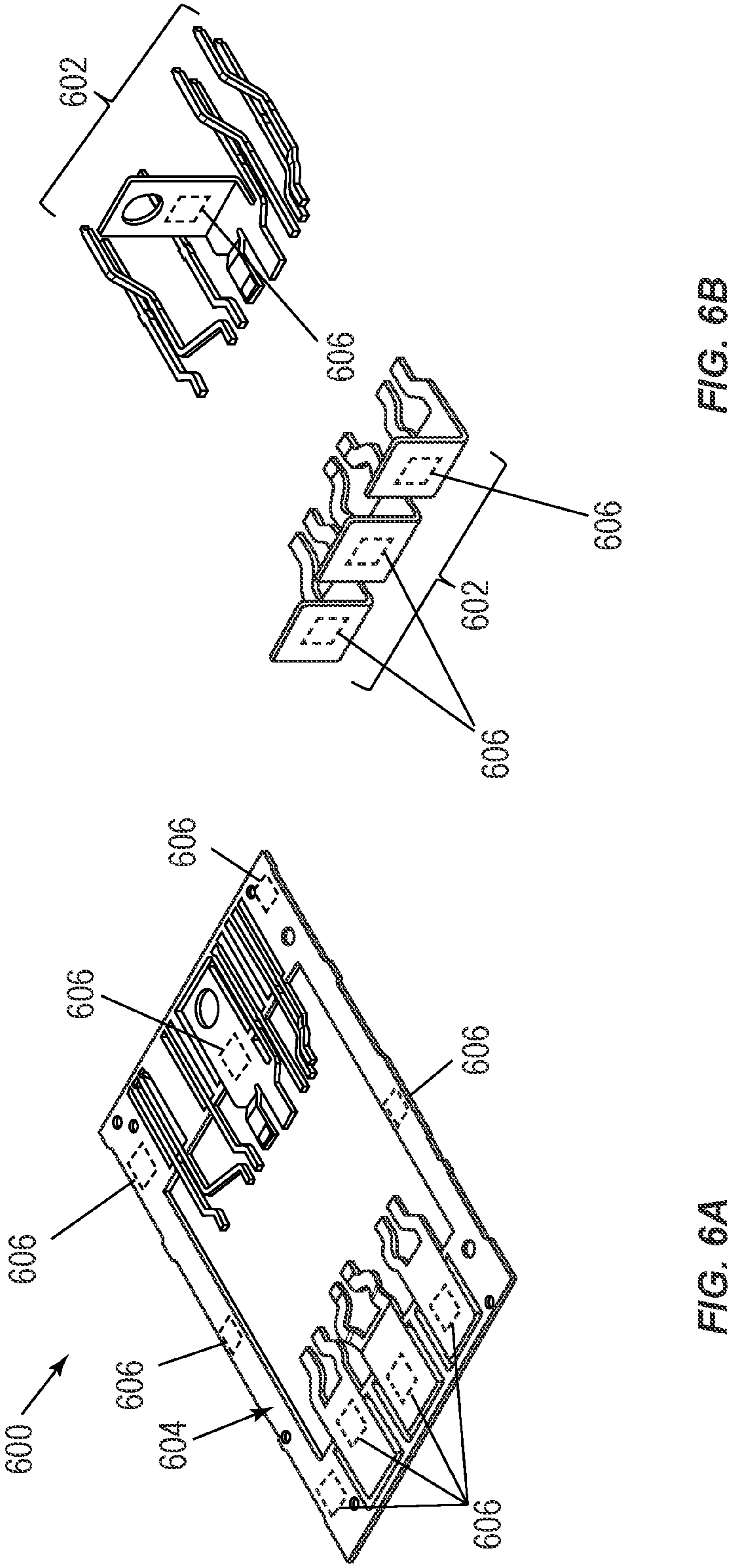
FIGS. 6A and 6B illustrate respective top perspective views of a lead frame for use in a power semiconductor package or module and having a structure that enhances readability of a barcode laser etched into a metallized surface of the lead frame.

FIGS. 6A and 6B illustrate respective top perspective views of a (metallic) lead frame 600 such as a Cu lead frame for use in a power semiconductor package or module. The lead frame 600 may be used to provide metallic terminals and/or busbars 602 for use in the power semiconductor package or module. FIG. 6A shows the lead frame 600 before separation of the metallic terminals and/or busbars 602 and FIG. 6B shows the metallic terminals and/or busbars 602 post separation. The metallic terminals and/or busbars 602 in FIGS. 6A and 6B may correspond to the metallic terminals and/or busbars 508 shown in FIG. 5.

The barcode 104 described herein may be laser etched into a surface 604 of the lead frame 600. Example locations 606 for the barcode 104 are indicated by dashed boxes in FIGS. 6A and 6B. Each barcode location 606 includes the laser etched barcode 104 described herein in combination with the wall structure 108 and/or the optically transparent encapsulant structure 200 also described herein. Accordingly, information encoded in the barcode 104 is optically readable during manufacture of the power semiconductor package or module that uses the metallic terminals and/or busbars 602 provided by the lead frame 600.

Figures 7A, 7B:
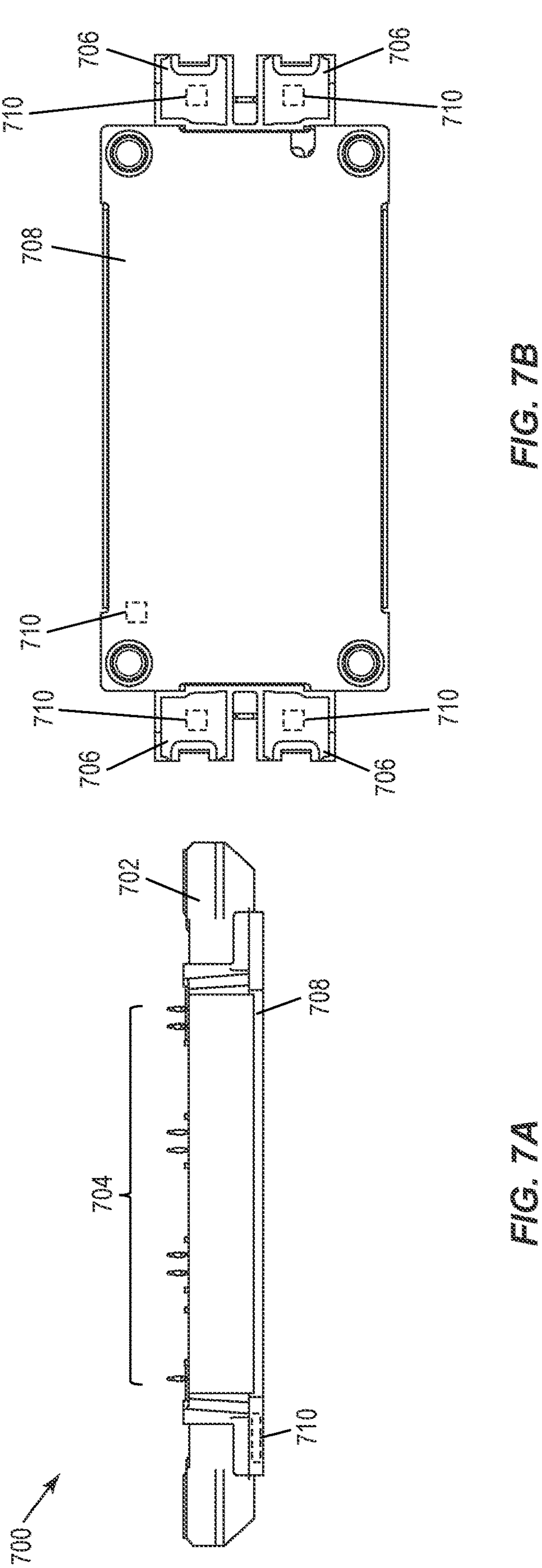
FIG. 7A illustrates a side perspective views of a power semiconductor module that includes a metallic baseplate and has a structure that enhances readability of a barcode laser etched into a surface of the metallic baseplate.
FIG. 7B illustrates a bottom perspective view of the power semiconductor module of FIG. 7A.

FIG. 7A illustrates a side perspective views of a power semiconductor module 700 and FIG. 7B illustrates a bottom perspective view of the power semiconductor module 700. The power semiconductor module 700 may form part of a power electronics circuit for use in various power applications such as a DC/AC inverter, a DC/DC converter, an AC/DC converter, a DC/AC converter, an AC/AC converter, a multi-phase inverter, an H-bridge, motor drive, etc. The power semiconductor module 700 includes power semiconductor dies attached to a substrate enclosed within an electrically insulative housing 702. The dies and substrate may be similar to what is shown in FIG. 5, as an example, and are obstructed by the housing 702 in FIGS. 7A and 7B and therefore not visible.

Pins 704 are attached to the substrate and/or another structure such as a metallic lead frame or clip frame enclosed by the housing 702, and protrude from the topside of the housing 702 to form an electrical connection interface outside the housing 702. Metallic busbars 706 are accessible at one or more sides of the electrically insulative housing 702 for providing a reference voltage to the power semiconductor module 100 and/or carrying current to or from the power semiconductor module 700. The lead frame 600 shown in FIGS. 6A and 6B may be used to provide the metallic busbars 706 for the power semiconductor module 700, as an example. The electrically insulative housing 702 is secured to a metallic baseplate 708, e.g., by an adhesive, plastic cement, etc. The backside of the metallic baseplate 708 may be exposed as shown in FIG. 7B, to provide a thermal pathway for conducting heat away from the power semiconductor module 700.

The barcode 104 described herein may be laser etched into a surface of one or more of the metallic busbars 706 and/or into a surface of the metallic baseplate 708. Example locations 710 for the barcode 104 are indicated by dashed boxes in FIGS. 7A and 7B. Each barcode location 710 includes the laser etched barcode 104 described herein in combination with the wall structure 108 and/or the optically transparent encapsulant structure 200 also described herein. Accordingly, information encoded in the barcode 104 is optically readable during manufacture of the power semiconductor module 700.

Figure 8B:
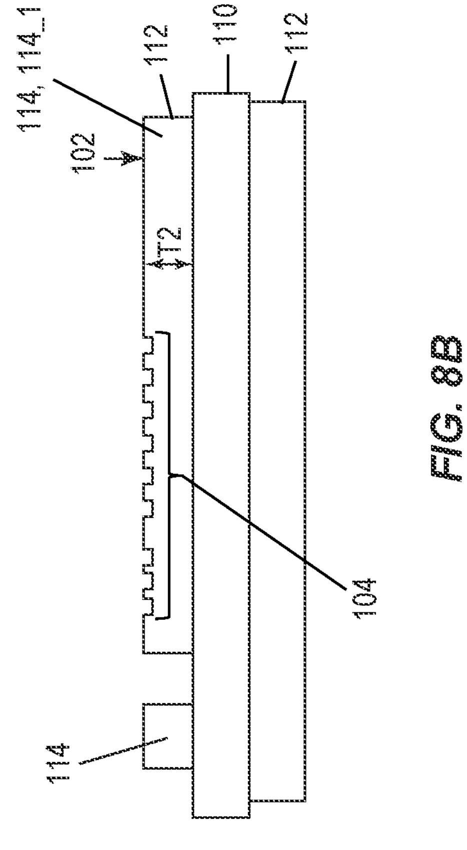
FIGS. 8A and 8B illustrate partial respective cross-sectional views of a method of removing metallic debris produced by laser etching of a barcode into a metallic surface of a substrate.
Figure 8A:
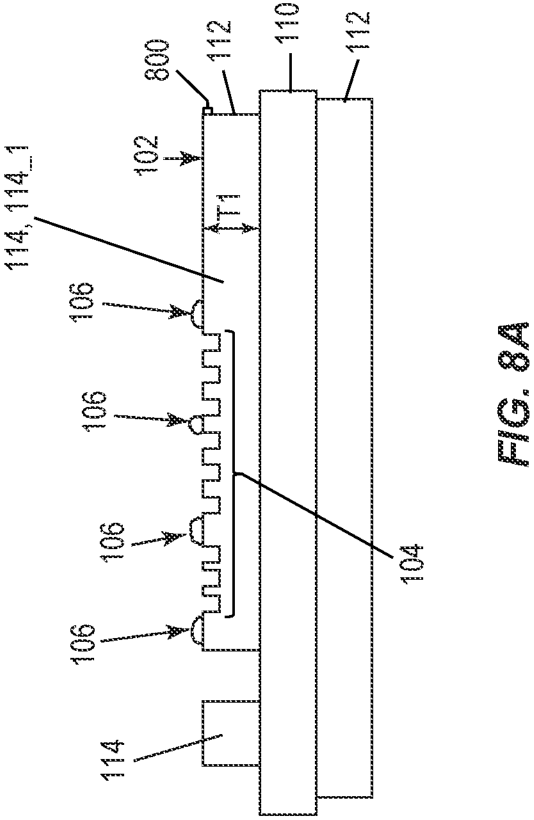

FIGS. 8A and 8B illustrate partial respective cross-sectional views of a method of removing metallic debris 106 produced by laser etching of a barcode 104 into a metallic surface 102 of a substrate 100. In FIGS. 8A and 8B, the substrate 100 includes an electrically insulative body 110 such as a ceramic or dielectric layer and a metallic layer 112 such as Cu or Al covering the electrically insulative body 110.

FIG. 8A shows the substrate 100 after laser etching of the barcode 104 into the metallic surface 102 of the substrate 100. The barcode 104 is decipherable by a barcode reader system (not shown) and may store information about the substrate 100 such as production lot, production date, part number, etc., as previously described herein.

FIG. 8B shows the substrate 100 after chemically etching the metallic surface 102 with the barcode 104. The chemical etching removes metallic debris 106 produced by the prior laser etching used to form the barcode 104. The chemical etching may include a solution of hydrogen peroxide and sulfuric acid, for example.

As shown in FIGS. 8A and 8B, the chemical etching removes a surface layer portion 800 of the metallic surface 102 with the barcode 104 ($T1>T2$). The method also includes selecting one or more parameters of the laser etching such that the barcode 104 is laser etched deep enough into the metallic surface 102 of the substrate 100 so as to remain optically detectable after the chemical etching of the metallic surface 102. That is, one or more parameters of the laser etching are selected such that the barcode 104 is laser etched to a depth in the metallic surface 102 that is greater than the thickness ($T1-T2$) of the surface layer portion 800 subsequently removed by the chemical etching. For example, the power (energy), focal depth, frequency, etc. of the laser process may be selected to ensure that the barcode 104 is laser etched deep enough into the metallic surface 102 of the substrate 100 so as to remain optically detectable after the chemical etching of the metallic surface 102.

Although the present disclosure is not so limited, the following numbered examples demonstrate one or more aspects of the disclosure.

Example 1. A substrate, comprising: a metallic surface; a barcode laser etched into the metallic surface; and a wall of non-metallic material formed on the metallic surface and framing the barcode.

Example 2. The substrate of example 1, further comprising: an electrically insulative body, wherein the metallic surface covers the electrically insulative body.

Example 3. The substrate of example 2, wherein the electrically insulative body is ceramic, wherein the metallic surface comprises a copper layer bonded to the electrically insulative body, and wherein the wall of non-metallic material is formed on the copper layer.

Example 4. The substrate of example 1, wherein the substrate is a lead frame, wherein the metallic surface is a surface of the lead frame, and wherein the wall of non-metallic material is formed on the surface of the lead frame.

Example 5. The substrate of example 1, wherein the substrate is a metallic baseplate, wherein the metallic surface is a surface of the metallic baseplate, and wherein the wall of non-metallic material is formed on the surface of the metallic baseplate.

Example 6. The substrate of example 1, wherein the substrate is a metallic terminal or busbar, wherein the metallic surface is a surface of the metallic terminal or busbar, and wherein the wall of non-metallic material is formed on the surface of the metallic terminal or busbar.

Example 7. The substrate of any of examples 1 through 4, wherein the metallic surface is patterned into a plurality of islands, wherein the barcode is laser etched into one of the islands, and wherein the wall of non-metallic material is formed on the same island as the barcode.

Example 8. The substrate of any of examples 1 through 7, wherein the wall of non-metallic material comprises polyimide.

Example 9. The substrate of any of examples 1 through 8, wherein metallic debris produced by laser etching of the barcode is disposed on the wall of non-metallic material.

Example 10. A substrate, comprising: a metallic surface; a barcode laser etched into the metallic surface; and an optically transparent encapsulant covering a region of the metallic surface that includes the barcode, wherein the optically transparent encapsulant reduces oxidation of metallic debris produced by laser etching of the barcode and that remains on or near the barcode.

Example 11. The substrate of example 10, further comprising: an electrically insulative body, wherein the metallic surface covers the electrically insulative body.

Example 12. The substrate of example 11, wherein the electrically insulative body is ceramic, wherein the metallic surface comprises a copper layer bonded to the electrically insulative body, and wherein the optically transparent encapsulant covers a region of the copper layer that includes the barcode.

Example 13. The substrate of example 10, wherein the substrate is a lead frame, wherein the metallic surface is a surface of the lead frame, and wherein the optically transparent encapsulant covers a region of the surface of the lead frame that includes the barcode.

Example 14. The substrate of example 10, wherein the substrate is a metallic baseplate, wherein the metallic surface is a surface of the metallic baseplate, and wherein the optically transparent encapsulant covers a region of the surface of the metallic baseplate that includes the barcode.

Example 15. The substrate of example 10, wherein the substrate is a metallic terminal or busbar, wherein the metallic surface is a surface of the metallic terminal or busbar, and wherein the optically transparent encapsulant covers a region of the surface of the metallic terminal or busbar that includes the barcode.

Example 16. The substrate of any of examples 10 through 13, wherein the metallic surface is patterned into a plurality of islands, wherein the barcode is laser etched into one of the islands, and wherein the optically transparent encapsulant covers a region of the island that includes the barcode.

Example 17. The substrate of any of examples 10 through 16, wherein the optically transparent encapsulant comprises polyimide.

Example 18. A substrate, comprising: an electrically insulative body; a metallic layer covering the electrically insulative body; a barcode laser etched into the metallic layer; and a trench formed in the metallic layer along a perimeter of the barcode and exposing the electrically insulative body.

Example 19. The substrate of example 18, wherein the metallic layer is patterned into a plurality of islands, wherein the barcode is laser etched into a region of one of the islands, wherein the trench is formed in the same island as the barcode, and wherein the region of the island with the barcode is electrically connected to the remainder of the island through one or more gaps in the trench filled by the metallic layer.

Example 20. The substrate of example 18 or 19, wherein metallic debris produced by laser etching of the barcode is disposed in the trench.

Example 21. The substrate of any of examples 18 through 20, further comprising: an optically transparent encapsulant covering a region of the metallic layer that includes the barcode, wherein the optically transparent encapsulant reduces oxidation of metallic debris produced by laser etching of the barcode and that remains on or near the barcode.

Example 22. A method of processing a substrate, the method comprising: laser etching a barcode into a metallic surface of the substrate; after the laser etching, chemically etching the metallic surface to remove a surface layer portion of the metallic surface; and selecting one or more parameters of the laser etching such that the barcode is laser etched deep enough into the metallic surface so as to remain optically detectable after the chemical etching of the metallic surface.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A substrate, comprising:

a metallic surface;

a barcode laser etched into the metallic surface; and a wall of non-metallic material formed on the metallic surface and framing the barcode, wherein metallic debris produced by laser etching of the barcode is disposed on the wall of non-metallic material.

2. The substrate of claim 1, further comprising:

an electrically insulative body, wherein the metallic surface covers the electrically insulative body.

3. The substrate of claim 2, wherein the electrically insulative body is ceramic, wherein the metallic surface comprises a copper layer bonded to the electrically insulative body, and wherein the wall of non-metallic material is formed on the copper layer.

4. The substrate of claim 1, wherein the substrate is a lead frame, wherein the metallic surface is a surface of the lead frame, and wherein the wall of non-metallic material is formed on the surface of the lead frame.

5. The substrate of claim 1, wherein the substrate is a metallic baseplate, wherein the metallic surface is a surface of the metallic baseplate, and wherein the wall of non-metallic material is formed on the surface of the metallic baseplate.

6. The substrate of claim 1, wherein the substrate is a metallic terminal or busbar, wherein the metallic surface is a surface of the metallic terminal or busbar, and wherein the wall of non-metallic material is formed on the surface of the metallic terminal or busbar.

7. The substrate of claim 1, wherein the metallic surface is patterned into a plurality of islands, wherein the barcode is laser etched into one of the islands, and wherein the wall of non-metallic material is formed on the same island as the barcode.

8. The substrate of claim 1, wherein the wall of non-metallic material comprises polyimide.

9. A substrate, comprising:

a metallic surface;

a barcode laser etched into the metallic surface; and an optically transparent encapsulant covering a region of the metallic surface that includes the barcode, wherein the optically transparent encapsulant reduces oxidation of metallic debris produced by laser etching of the barcode and that remains on or near the barcode.

10. The substrate of claim 9, further comprising:

an electrically insulative body, wherein the metallic surface covers the electrically insulative body.

11. The substrate of claim 10, wherein the electrically insulative body is ceramic, wherein the metallic surface comprises a copper layer bonded to the electrically insulative body, and wherein the optically transparent encapsulant covers a region of the copper layer that includes the barcode.

12. The substrate of claim 9, wherein the substrate is a lead frame, wherein the metallic surface is a surface of the lead frame, and wherein the optically transparent encapsulant covers a region of the surface of the lead frame that includes the barcode.

13. The substrate of claim 9, wherein the substrate is a metallic baseplate, wherein the metallic surface is a surface of the metallic baseplate, and wherein the optically transparent encapsulant covers a region of the surface of the metallic baseplate that includes the barcode.

14. The substrate of claim 9, wherein the substrate is a metallic terminal or busbar, wherein the metallic surface is a surface of the metallic terminal or busbar, and wherein the optically transparent encapsulant covers a region of the surface of the metallic terminal or busbar that includes the barcode.

15. The substrate of claim 9, wherein the metallic surface is patterned into a plurality of islands, wherein the barcode is laser etched into one of the islands, and wherein the optically transparent encapsulant covers a region of the island that includes the barcode.

16. The substrate of claim 9, wherein the optically transparent encapsulant comprises polyimide.

17. A substrate, comprising:

an electrically insulative body;

a metallic layer covering the electrically insulative body;

a barcode laser etched into the metallic layer; and a trench formed in the metallic layer along a perimeter of the barcode and exposing the electrically insulative body, wherein metallic debris produced by laser etching of the barcode is disposed in the trench.

18. The substrate of claim 17, wherein the metallic layer is patterned into a plurality of islands, wherein the barcode is laser etched into a region of one of the islands, wherein the trench is formed in the same island as the barcode, and wherein the region of the island with the barcode is electrically connected to the remainder of the island through one or more gaps in the trench filled by the metallic layer.

19. The substrate of claim 18, further comprising:

an optically transparent encapsulant covering a region of the metallic layer that includes the barcode, wherein the optically transparent encapsulant reduces oxidation of the metallic debris.

20. A substrate, comprising:

an electrically insulative body;

a metallic layer covering the electrically insulative body;

a barcode laser etched into the metallic layer; and a trench formed in the metallic layer along a perimeter of the barcode and exposing the electrically insulative body, wherein the metallic layer is patterned into a plurality of islands, wherein the barcode is laser etched into a region of one of the islands, wherein the trench is formed in the same island as the barcode, wherein the region of the island with the barcode is electrically connected to the remainder of the island through one or more gaps in the trench filled by the metallic layer.

* * * * *